(12) United States Patent
Cazaux et al.

(10) Patent No.: US 7,067,792 B2
(45) Date of Patent: Jun. 27, 2006

(54) CONTROL OF A PHOTOSENSITIVE CELL

(75) Inventors: Yvon Cazaux, Grenoble (FR); François Roy, Seyssins (FR)

(73) Assignee: STMicroelectronics S.A., Montrouge (FR)

( * ) Notice: Subject to any disclaimer, the term of this patent is extended or adjusted under 35 U.S.C. 154(b) by 96 days.

(21) Appl. No.: 10/682,187

(22) Filed: Oct. 9, 2003

(65) Prior Publication Data
US 2004/0135070 A1    Jul. 15, 2004

(30) Foreign Application Priority Data
Oct. 16, 2002  (FR) .................................. 02 12851

(51) Int. Cl.
G01J 1/44 (2006.01)
H01J 40/14 (2006.01)
H03F 3/08 (2006.01)
H01L 31/00 (2006.01)

(52) U.S. Cl. .............................. 250/214.1; 250/214 R; 348/308

(58) Field of Classification Search ............. 250/214.1, 250/214 R, 208.1; 327/514; 348/302, 307–310
See application file for complete search history.

(56) References Cited

U.S. PATENT DOCUMENTS
5,818,526 A * 10/1998 Nomoto ...................... 348/302
5,898,168 A *  4/1999 Gowda et al. ........... 250/208.1
6,043,479 A *  3/2000 Chiang .................... 250/208.1

OTHER PUBLICATIONS
French Search Report from French Patent Application No. 02/12851, filed Oct. 16, 2002.

* cited by examiner

Primary Examiner—Stephone B. Allen
Assistant Examiner—Suezu Ellis
(74) Attorney, Agent, or Firm—Lisa K. Jorgenson; James H. Morris; Wolf, Greenfield & Sacks, P.C.

(57) ABSTRACT

A device and a method for controlling a photosensitive cell including a photodiode adapted to discharging into a read node via a MOS transfer transistor, the device being adapted to providing a signal for controlling the gate of the MOS transfer transistor to a first level for which the MOS transfer transistor is off or to a second level for which the MOS transfer transistor is on, including means for providing a transition control signal between the second level and the first level of determined average slope.

14 Claims, 3 Drawing Sheets

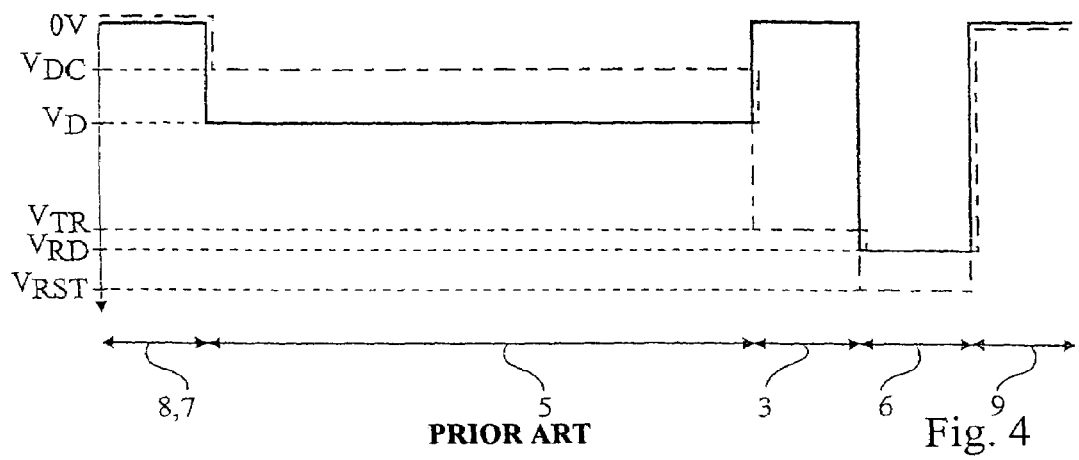
PRIOR ART    Fig. 4
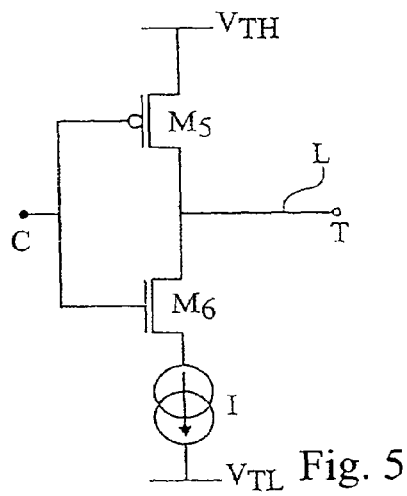
Fig. 5
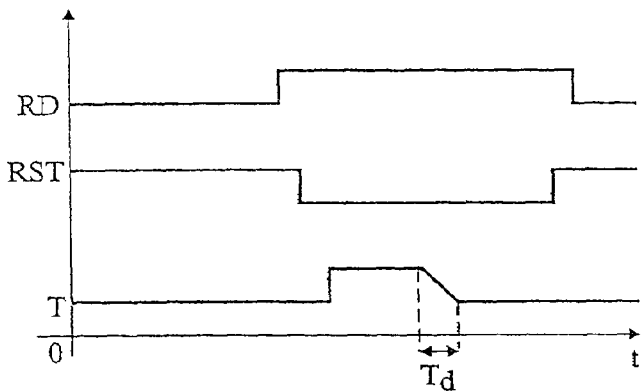
Fig. 6
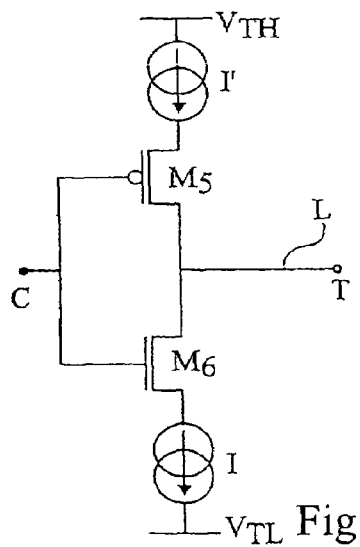
Fig. 7
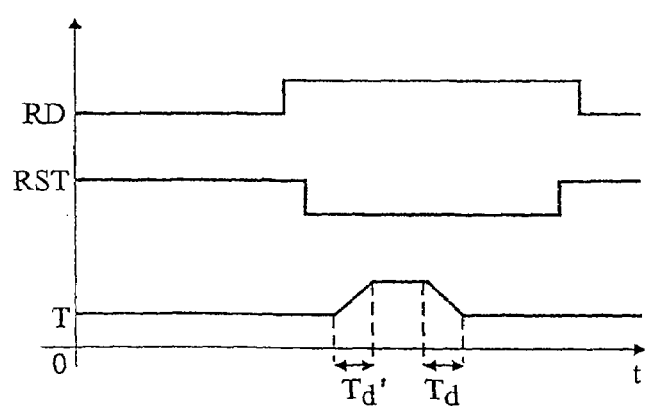
Fig. 8

CONTROL OF A PHOTOSENSITIVE CELL

BACKGROUND OF THE INVENTION

1. Field of the Invention

The present invention relates to the control of a photosensitive cell made in monolithic form of an image sensor intended to be used in shooting devices such as, for example, shooting cameras, camcorders, digital microscopes, or digital cameras. More specifically, the present invention relates to a photosensitive cell based on semiconductors.

2. Discussion of the Related Art

FIG. 1 schematically shows the circuit of a photosensitive cell of a photosensitive cell array of an image sensor. With each photosensitive cell of the array are associated a precharge device and a read device. The precharge device is formed of an N-channel MOS transistor $M_1$, interposed between a supply rail Vdd and a read node S. The gate of precharge transistor $M_1$ receives a precharge control signal RST. The read device is formed of the series connection of two N-channel MOS transistors, $M_2$, $M_3$. The drain of first read transistor $M_2$ is connected to supply rail Vdd. The source of second read transistor $M_3$ is connected to input terminal P of an electronic processing circuit (not shown). The gate of first read transistor $M_2$ is connected to read node S. The gate of second read transistor $M_3$ is capable of receiving a read signal $R_D$. The photosensitive cell comprises a charge storage diode $D_1$ having its anode connected to a reference supply rail or circuit ground GND and its cathode directly connected to node S. The photosensitive diode comprises a photodiode $D_2$ having its anode connected to reference supply rail GND and its cathode connected to node S via an N-channel charge transfer MOS transistor $M_4$. The gate of charge transfer transistor $M_4$ is capable of receiving a charge transfer control signal T. Generally, signals $R_D$, RST, and T are provided by control circuits not shown in FIG. 1 and can be provided to all the photosensitive cells of a same row of the cell array.

FIG. 2 shows an example of a timing diagram of signals $R_D$, RST, T, and of voltage $V_{RD}$ at node S of the circuit of FIG. 1 for a read cycle of the photosensitive cell of FIG. 1. Signals $R_D$, RST, and T are binary signals varying between high and low levels that can be different for each of the signals.

Between two read cycles of the photosensitive cell, signal T is low. Transfer transistor $M_4$ is thus off. The lighting causes the forming and the storage of charges at the level of photodiode $D_2$. Further, signal RST is high. Precharge transistor $M_1$ is thus on. Voltage $V_{RD}$ is then substantially equal to voltage Vdd.

At a time $t_0$, the array row containing the photosensitive cell to be read is selected by setting, to the high level, signal $R_D$. The precharge of read node S is interrupted by setting at time $t_1$ signal RST to the low state, thus turning off precharge transistor $M_1$. Voltage $V_{RD}$ at read node S is then set to a precharge level $V_{RST}$ which can be lower than voltage Vdd due to a coupling with precharge transistor $M_1$. Precharge level $V_{RST}$ is generally disturbed by noise essentially originating from the thermal noise of the channel of precharge transistor $M_1$. This noise is sampled and maintained on charge storage diode $D_1$ upon turning-off of precharge transistor $M_1$. Precharge level $V_{RST}$ is then stored outside of the photosensitive cell via read transistors $M_2$, $M_3$.

At time $t_2$, signal T is set to the high state. Transfer transistor $M_4$ is then on; which enables transfer of the charges stored in photodiode $D_2$ to read node S. Photodiode $D_2$ is designed so that all the charges stored therein are transferred to read node S. Voltage $V_{RD}$ then decreases to reach a wanted signal level $V_{RD}$. Once the charge transfer has been performed, signal T is set at time $t_3$ to the low level, thus enabling isolating photodiode $D_2$ again and resuming a cycle of charge forming and storage due to the lighting. Desired signal level $V_{RD}$ is then read via read transistors $M_2$, $M_3$. Like precharge level $V_{RST}$, desired signal level $V_{RD}$ is especially disturbed by the thermal noise of the channel of precharge transistor $M_1$, which has been sampled and maintained on charge storage diode $D_1$. The subtraction of signals $V_{RD}$ and $V_{RST}$ by the processing circuit enables suppressing the noise of precharge transistor $M_1$ by a double correlated sampling. Once the reading is over, signal RST is set to the high state at time $t_4$ to precharge read node S again. Finally, at time $t_6$, signal $R_D$ is set to the low state to deselect the photosensitive cell.

It is possible for diode $D_1$ not to be formed by a specific component. The function of storing the charges originating from photodiode $D_2$ is then ensured by the apparent capacitance at read node S which is formed of the capacitances of the sources of transistors $M_1$ and $M_4$, of the input capacitance of transistor $M_2$, as well as of all the stray capacitances present at node S.

FIG. 3 illustrates, in a partial simplified cross-section view, an implementation in monolithic form of the assembly of photodiode $D_2$ and of transfer transistor $M_4$ of FIG. 1. These elements are formed in a same active area of a lightly-doped semiconductor substrate 1 of a first conductivity type, for example, type P (P⁻). This substrate for example corresponds to an epitaxial layer on a silicon wafer which forms reference supply rail GND. The active area is delimited by field insulation areas 2, for example, made of silicon oxide ($SiO_2$), and corresponds to a well 3 of the same conductivity type as underlying substrate 1, but more heavily doped. Above the surface of well 3 is formed an insulated gate structure 4 possibly provided with lateral spacers. On either side of gate 4, at the surface of well 3, are source and drain regions 5 and 6 of the opposite conductive type, for example, N. Drain region 6, to the right of gate 4, is heavily doped (N⁺). Source region 5 is formed on a much larger surface area than drain region 6 and forms with underlying substrate 3 the junction of photodiode $D_2$. Gate 4 and drain 6 form one piece with metallizations (not shown) which enable putting these regions in contact respectively with transfer control signal T and the gate of transistor $M_2$ (node S). The structure is completed by heavily-doped P-type regions 8 and 9 (P⁺). Regions 8 and 9, underlying areas 2, are connected to the reference or ground voltage via well 3 and substrate 1. Photodiode $D_2$ is of the so-called completely depleted type and comprises, at the surface of its source 5, a P-type region 7, shallow and more heavily doped (P⁺) than well 3. Region 7 is in lateral (vertical) contact with region 8. It is thus permanently maintained at the reference voltage level.

FIG. 4 schematically illustrates the voltage levels of the different regions of FIG. 2. The curve in strip-dot lines illustrates the system state just after time $t_2$. Heavily-doped P-type regions 7, 8, and 9 are permanently maintained at the reference or ground voltage, for example, 0 V. Region 5 of photodiode $D_2$, completely charged, is at a voltage $V_{DC}$. Transistor $M_4$ is on. Channel region 3 of transistor $M_4$ is at a voltage $V_{TR}$. Region 6 corresponding to node S is at precharge level $V_{RST}$. Between times $t_2$ and $t_3$, the charges accumulated in region 5 are transferred to region 6. The curve in full line illustrates the system state just after time $t_3$.

The charges stored in photodiode $D_2$ being completely transferred to node S, photodiode $D_2$ reaches a so-called depletion quiescent level $V_D$ set by the sole characteristics of photodiode $D_2$. Transfer transistor $M_4$ being off, channel region 3 is at 0 V. Region 6 is at the level of wanted signal $V_{RD}$. Region 5 of photodiode $D_2$ then forms an empty potential well which refills according to the photodiode lighting.

Generally, the high level of transfer control signal T applied to the gate of transfer transistor $M_4$ is such that the voltage in channel region 3 of transistor $M_4$ is intermediary between depletion level $V_D$, and wanted signal level $V_{RD}$, in such voltage conditions.

For denser and denser technologies with photosensitive cells of small dimensions and lower and lower control signals, it becomes difficult to ensure a good charge transfer from photodiode $D_2$ to read node S.

To improve the charge transfer, it is possible to increase the high level of signal T applied on the gate of transfer transistor $M_4$ to increase the intensity of the electric field enabling the charge flow. However, if the level of the channel of transfer transistor $M_4$ becomes relatively too high with respect to supply voltage Vdd, charges may be stored during the charge transfer in channel region 3 of transfer transistor $M_4$ due to the capacitive character of transistor $M_4$. Charges can thus be sent back to photodiode $D_2$ at the falling edge of signal T from the high level to the low level at time $t_3$. This may translate as an error on the measured wanted signal level $V_{RD}$ and result in a so-called "trailing" effect upon successive readings of a photosensitive cell, due to the reading of residual charges of the previous image upon reading of the next image.

SUMMARY OF THE INVENTION

The present invention provides a method and a device for controlling a photosensitive cell enabling ensuring complete transfer of the charges from the photodiode to the read node.

To achieve these and other objects, the present invention provides a device for controlling a photosensitive cell comprising a photodiode adapted to discharging into a read node via a MOS transfer transistor, said device being adapted to providing a signal for controlling the gate of the MOS transfer transistor to a first level for which the MOS transfer transistor is off or to a second level for which the MOS transfer transistor is on, comprising means for providing a transition control signal between the second level and the first level of determined average slope.

According to an embodiment of the present invention, the device comprises a MOS transistor of a first conductivity type connected to a voltage source at the second level and to a control line, said control line being connected to the gate of the transfer MOS transistor, and a MOS transistor of a second conductivity type connected to said control line and to a terminal of a constant current source, the other terminal of said constant current source being connected to a voltage source at the first level.

According to an embodiment of the present invention, the device further comprises a constant current source arranged between the transistor of the first conductivity type and the voltage source at the second level.

According to an embodiment of the present invention, the gates of the transistors of the first and second conductivity types receive a binary signal.

According to an embodiment of the present invention, the control signal is simultaneously provided to the gates of the transfer transistors of several photosensitive cells.

The present invention also provides a method for controlling a photosensitive cell, comprising a photodiode adapted to discharging into a read node via a MOS transfer transistor, comprising providing to the gate of the MOS transfer transistor a control signal at a first level to turn off said transfer transistor or at a second level to turn on said transfer transistor, and comprising providing, upon transition from the second level to the first level, a control signal of determined average slope.

According to an embodiment of the present invention, he control signal is a signal of non-zero finite slope between the second level and the first level.

According to an embodiment of the present invention, the control signal comprises an intermediary stage with a zero slope between the second level and the first level.

According to an embodiment of the present invention, the duration of said transition of the control signal from the second level to the first level is greater than 50 ns.

The foregoing object, features, and advantages of the present invention will be discussed in detail in the following non-limiting description of specific embodiments in connection with the accompanying drawings.

BRIEF DESCRIPTION OF THE DRAWINGS

FIG. 4, previously described, schematically illustrates voltage levels in the structure of FIG. 3;

FIG. 5 shows a first embodiment of the last stage of a control circuit providing charge transfer control signal T;

FIG. 6 shows a timing diagram of voltages characteristic of the circuit of FIG. 1 controlled by the control circuit of FIG. 5;

FIG. 7 shows a second embodiment of the last stage of the control circuit;

FIG. 8 shows a timing diagram of voltages characteristic of the circuit of FIG. 1 controlled by the control circuit of FIG. 7.

DETAILED DESCRIPTION

Figure 3:
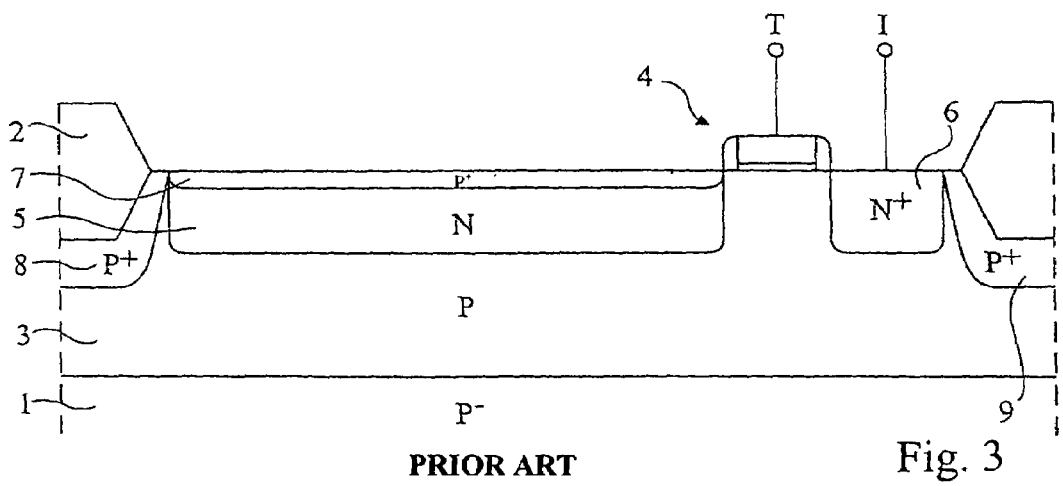
FIG. 3, previously described, shows a simplified partial cross-section view of a portion of the circuit of FIG. 1 made in monolithic form.
Figure 9:
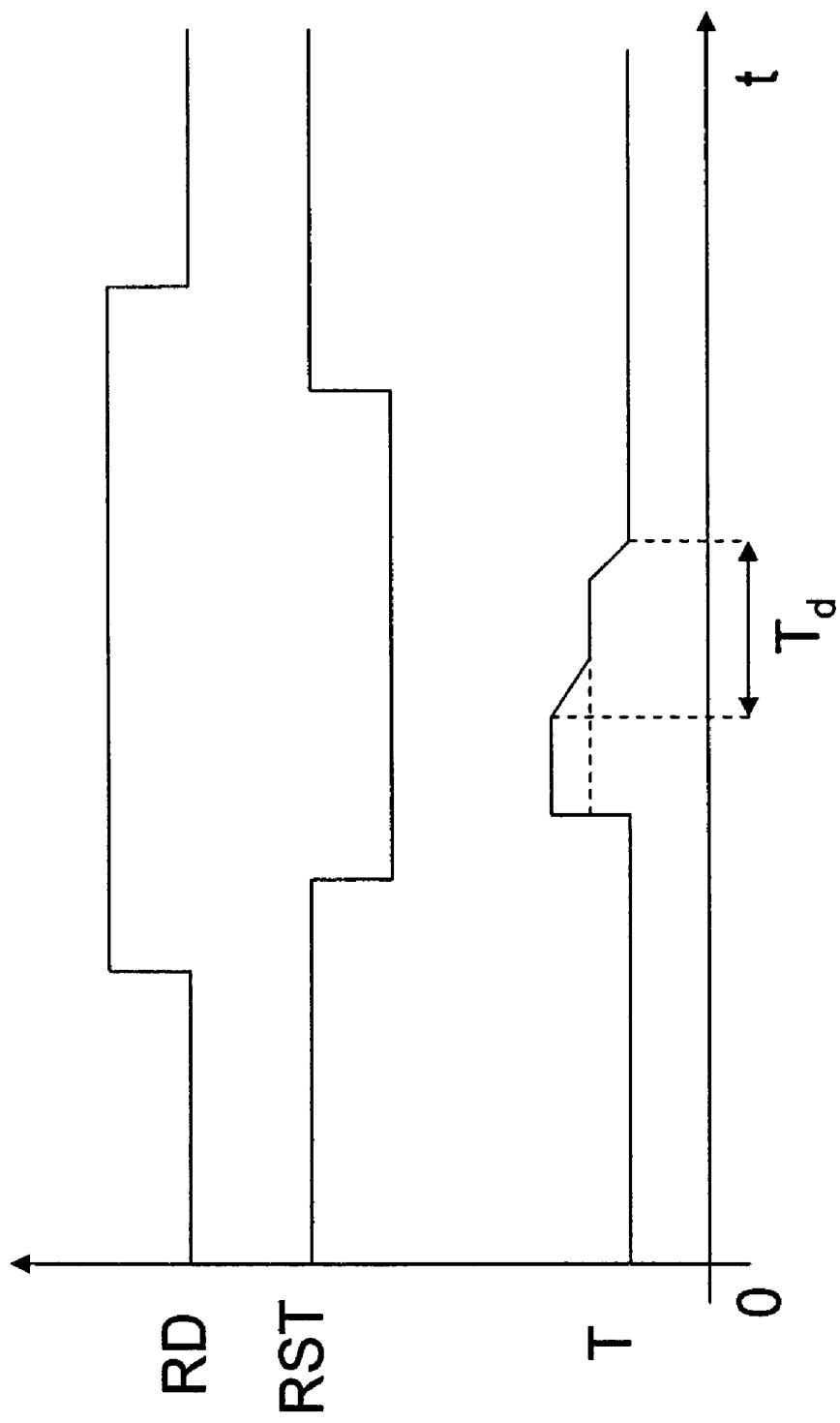
FIG. 9 shows a timing diagram illustrating an example of a control signal transition that is controlled such that the signal has an intermediate stage of zero slope during the transition.

The same elements have been referred to with the same reference numerals in the different drawings and, further, as usual in the representation of integrated circuits, FIG. 3 is not drawn to scale.

The present invention comprises providing a charge transfer control signal T having a determined average slope upon transition between the high level and the low level to enable complete transfer of the charges between photodiode $D_2$ and read node S.

FIG. 5 shows a first embodiment of the last stage of a control circuit providing charge transfer control signal T to the gate of transfer transistor $M_4$. The control circuit may be connected to a line L connected to all the transfer transistor gates of the photosensitive cells of a same photosensitive cell row. The control circuit comprises a P-type MOS transistor $M_5$ having its drain connected to a high-level voltage source $V_{TH}$ and having its source connected to line L. The control circuit comprises an N-type MOS transistor $M_6$ having its drain connected to line L and having its source connected to a terminal of a constant current source I providing a current of intensity Id. The other terminal of constant current source I is connected to a low-level voltage source $V_{TL}$. The gates of transistors $M_5$, $M_6$ each receive a binary signal C provided by the preceding stage of the control circuit. According to an alternative of the present invention, the gates of transistors $M_5$, $M_6$ are not connected and each receive a distinct control signal.

When signal C is low, transistor $M_6$ is off and transistor $M_5$ is on. Transfer control signal T is then at high level $V_{TH}$. When signal C switches high, transistor $M_5$ is off and transistor $M_6$ is on. Line L, as seen from the control circuit, exhibits an apparent capacitance $C_L$ originating among others from the gates capacitances of the charge transfer transistors of the different photosensitive cells in the row. Current source I then causes a transition of constant slope of signal T from high level $V_{TH}$ to low level $V_{TL}$. The duration of the transition between the high and low levels is given by the following relation:

$$T_d = C_L(V_{TH} - V_{TL})/I_d$$

The constant slope of transfer control signal T is adjusted to enable all the charges present under the gate of transfer transistor $M_4$ to flow towards read node S before the voltage of the channel of transfer transistor $M_4$ reaches the reference level, for example, 0 volt. The phenomenon of charges returning to photodiode $D_2$ is then suppressed. It is desired to obtain a maximum value of $T_d$ of approximately 0.5 μs and preferably of approximately 0.2 μs. For this purpose, one can choose $V_{TH}$ equal to 3.5 V, $V_{TL}$ equal to 0 V, and $C_L$ equal to several picofarads.

Figure 1:
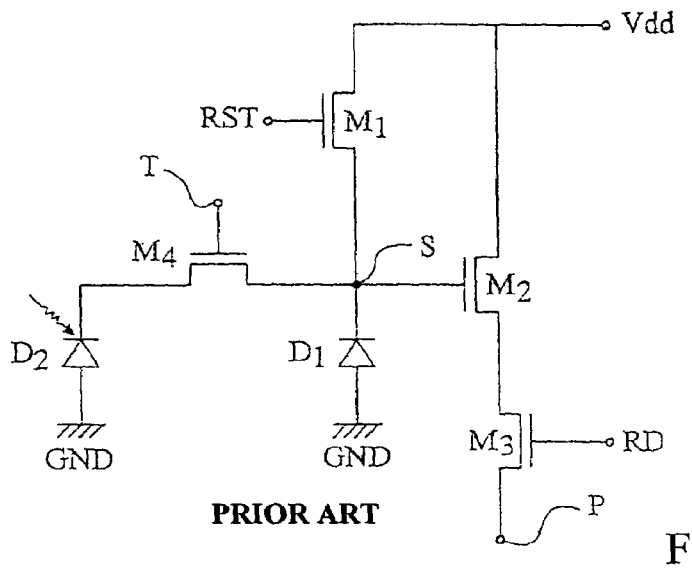
FIG. 1, previously described, shows an electric diagram of a photosensitive cell.
Figure 2:
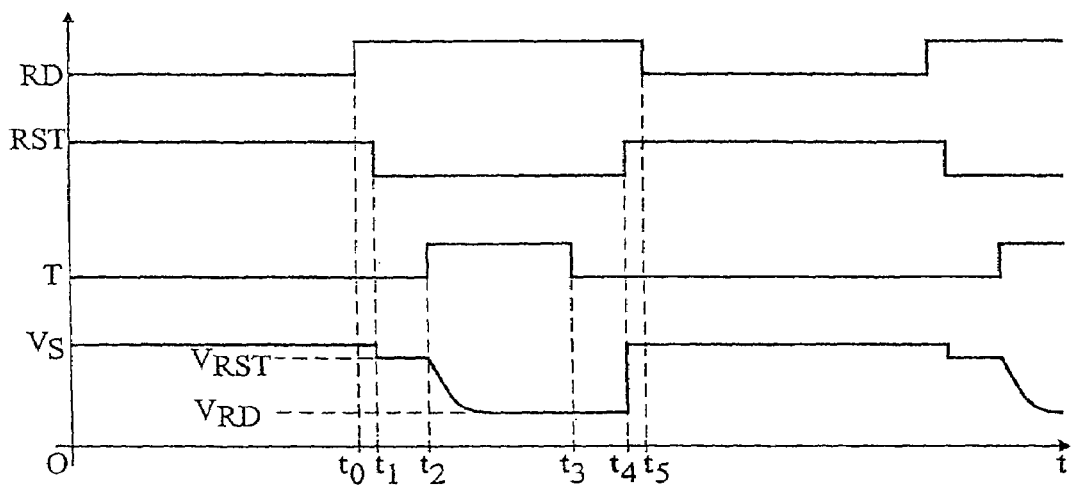
FIG. 2, previously described, illustrates a timing diagram of characteristic voltages of the circuit of FIG. 1.

FIG. 6 shows a timing diagram of signals $R_D$, RST, and T of the photosensitive cell of FIG. 1 receiving a transfer control signal T provided by the control circuit of FIG. 5. Duration $T_d$ can be adjusted by intensity $I_d$ of the current provided by current source 1. Current source I may be formed in any known manner, for example, by a current mirror.

FIG. 7 shows a second embodiment of the last stage of the control circuit providing signal T. As compared to the circuit of FIG. 5, the circuit according to the second embodiment comprises a second constant current source I' providing a current of intensity $I_d'$ and arranged between the drain of transistor $M_5$ and the source of high-level voltage $V_{TH}$. Second constant current source I' enables ensuring a transition at constant slope of a duration $T_d'$ of signal T between low level $V_{TL}$ and high level $V_{TH}$. Duration $T_d'$ is given by a relation similar to the expression of duration $T_d$, in which the amount of current $I_d$ is replaced by the amount of current $I_d'$ provided by constant current source I'.

Preferably, current sources I, I' provide currents of the same value so that durations $T_d$ and $T_d'$ are equal. This enables obtaining symmetrical rising and falling edges of signal T and suppressing unwanted coupling effects which can appear with the control circuit of FIG. 5.

According to an alternative of the present invention, not shown, the control circuit may provide a transfer control signal T which exhibits upon switching from the high level to the low level one stage or several intermediary stages at constant intermediary levels between high and low levels $V_{TH}$ and $V_{TL}$. The intermediary level and the duration of the stage are set to ensure a complete charge transfer from photodiode $D_2$ to read node S. The intermediary level is such that the voltage of the channel of charge transfer transistor $M_4$ is smaller than $V_D$ to leave time to the charges present under transistor $M_4$ to set off to read node S. A stage may also be provided upon transition of signal T from the low level to the high level.

According to an alternative of the present invention, not shown, the control circuit may provide a transfer control signal T which exhibits upon switching from the high level to the low level one or several portions at non-zero constant slope, it being possible to provide the portions at constant slope between the high level and an intermediary level between the high and low levels, between an intermediary level between the high and low levels and the low level, or between a first intermediary level between the high and low levels and a second intermediary level between the high and low levels smaller than the first intermediary level.

According to an alternative of the present invention, not shown, transfer control signal T may exhibit upon switching from the high level to the low level a succession of portions at non-zero constant slope or of portions at zero slope.

According to an alternative of the present invention, not shown, transfer control signal T may exhibit upon switching from the high level to the low level one or several portions at non-constant slope varying according to a determined law.

According to another alternative of the present invention, two control circuits operating identically may be arranged at both ends of line L.

Of course, the present invention is likely to have various alterations, modifications, and improvement which will readily occur to those skilled in the art. In particular, the drain of second read MOS transistor $M_3$ may be connected to supply rail Vdd, and the source of second transistor $M_3$ may be connected to the drain of first read transistor $M_2$. The source of first read transistor $M_2$ is then connected to input terminal P of the processing circuit. The operation of such a photosensitive cell is similar to what has been described previously. Further, the present invention has been described in the context of a photosensitive cell in which four MOS transistors are associated with a photodiode. However, the present invention may apply to photosensitive cells in which some of the MOS transistors, especially read transistor $M_2$ and $M_3$ and precharge transistors $M_1$, are put in common between several photodiodes. Further, in the present invention, some of said N-type transistors may be replaced with P-type transistors by accordingly modifying the associated gate control signals.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A device for controlling a photosensitive cell comprising a photodiode adapted to discharging into a read node via a MOS transfer transistor, said device being adapted to providing a signal for controlling the gate of the MOS transfer transistor to a first level for which the MOS transfer transistor is off or to a second level for which the MOS transfer transistor is on, and comprising means for providing a control signal having a predefined average slope for a duration of a transition of the control signal between the second level and the first level, and the means further comprises;

a MOS transistor of a first conductivity type connected to a voltage source at the second level and to a control line, said control line being connected to the gate of the transfer MOS transistor; and a MOS transistor of a second conductivity type connected to said control line and to a terminal of a constant current source, another terminal of said constant current source being connected to a voltage source at the first level.

2. The device of claim 1, further comprising the constant current source arranged between the transistor of the first conductivity type and the voltage source at the second level.

3. The device of claim 1, wherein the gates of the transistors of the first and second conductivity types receive a binary signal.

4. The device of claim 1, wherein the control signal is simultaneously provided to the gates of the transfer transistors of several photosensitive cells.

5. A method for controlling a photosensitive cell, comprising a photodiode adapted to discharging into a read node via a MOS transfer transistor, comprising providing to the gate of the MOS transfer transistor a control signal at a first level to turn off said transfer transistor or at a second level to turn on said transfer transistor, and comprising providing a control signal transition having a predefined average slope for a duration of the control signal transition between the second level and the first level, wherein the control signal transition has an intermediary stage with a zero slope between the second level and the first level.

6. The method of claim 5, wherein the control signal transition comprises a portion that has a non-zero finite slope between the second level and the first level.

7. The method of claim 5, wherein the duration of said transition of the control signal from the second level to the first level is greater than 50 ns.

8. A control circuit for a circuit comprising a photosensitive component, the control circuit comprising:

a first switch having a control terminal;

a circuit that provides a signal to the control terminal, the signal having a controlled transition from a first voltage level to a second voltage level;

a first MOS transistor of a first conductivity type coupled to the control terminal; and a second MOS transistor of a second conductivity type coupled to the control terminal and to a first terminal of a constant current source, a second terminal of the constant current source being coupled to a voltage source that provides the first voltage level.

9. The control circuit of claim 8, wherein the controlled transition from the first voltage level to the second voltage level is substantially linear.

10. The control circuit of claim 8, wherein a duration of the controlled transition from the first voltage level to the second voltage level is greater than 50 ns.

11. The device of claim 8, wherein the signal is simultaneously provided to several photosensitive cells.

12. A method of controlling a circuit that comprises a photosensitive component and a switch, the method comprising:

providing to a control terminal of the switch, a signal having a first voltage level;

providing to the control terminal of the switch, a signal having a second voltage level; and providing to the control terminal of the switch, a signal having a transition from the first voltage level to the second voltage level, a duration of the transition being controlled, wherein the transition is controlled such that the signal has an intermediate stage of zero slope during the transition.

13. The method of claim 12, wherein the duration is controlled to be greater than 50 ns.

14. The method of claim 12, wherein the transition is controlled according to a determined law.

* * * * *